(12) United States Patent
Cho

(10) Patent No.: US 11,811,320 B2
(45) Date of Patent: Nov. 7, 2023

(54) POWER CONVERSION CIRCUIT HAVING SHORT-CIRCUIT DETECTION FUNCTION AND SHORT-CIRCUIT DETECTION METHOD THEREOF

(71) Applicant: RICHTEK TECHNOLOGY CORPORATION, Zhubei (TW)

(72) Inventor: Je-Kwang Cho, Seoul (KR)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 125 days.

(21) Appl. No.: 17/553,535

(22) Filed: Dec. 16, 2021

(65) Prior Publication Data

US 2023/0198403 A1    Jun. 22, 2023

(51) Int. Cl.
    *H02M 3/158*    (2006.01)
    *H02M 1/32*     (2007.01)
    *H02H 7/12*     (2006.01)
    *G01R 31/52*    (2020.01)

(52) U.S. Cl.
    CPC ............. *H02M 3/158* (2013.01); *H02M 1/32* (2013.01); *G01R 31/52* (2020.01); *G09G 2330/12* (2013.01); *H02H 7/1213* (2013.01); *H02M 3/1582* (2013.01)

(58) Field of Classification Search
    CPC ................. H02M 1/0032; H02M 1/32; H02M 3/155–1588; G01R 31/52; H02H 1/003; H02H 7/1213; G09G 2330/12
    See application file for complete search history.

(56) References Cited

U.S. PATENT DOCUMENTS

| | | | |
|---|---|---|---|
| 10,483,755 B2 | 11/2019 | Park | |
| 2011/0234255 A1* | 9/2011 | Chobot | H05B 45/50 323/284 |
| 2012/0319662 A1* | 12/2012 | Kung | H02M 3/1588 323/271 |
| 2016/0373002 A1* | 12/2016 | Borfigat | H02M 1/32 |
| 2019/0172379 A1* | 6/2019 | Park | H02M 1/32 |
| 2019/0318705 A1* | 10/2019 | Lee | G09G 3/3696 |
| 2022/0045608 A1* | 2/2022 | Bertolini | H02M 3/1588 |

* cited by examiner

*Primary Examiner* — Fred E Finch, III
(74) *Attorney, Agent, or Firm* — Tung & Associates

(57) ABSTRACT

A power conversion circuit includes a first and a second power converters for generating a first and a second driving voltages respectively. The second power converter is a switching converter. In a short-circuit detection mode, the first driving voltage is regulated to the first driving level, and the second power converter is configured to operate in a pulse frequency modulation mode to regulate the second driving voltage to a short-circuit detection level, and when a switching frequency of the second power converter exceeds a threshold frequency, a short-circuit condition between the second driving voltage and the first driving voltage is determined.

22 Claims, 13 Drawing Sheets

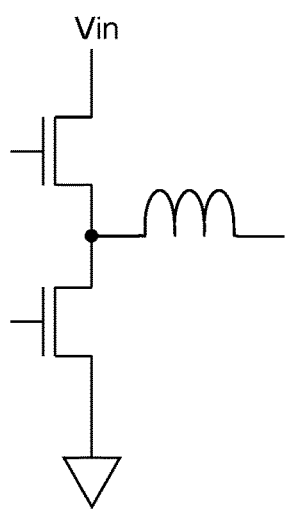
【Fig. 6A】
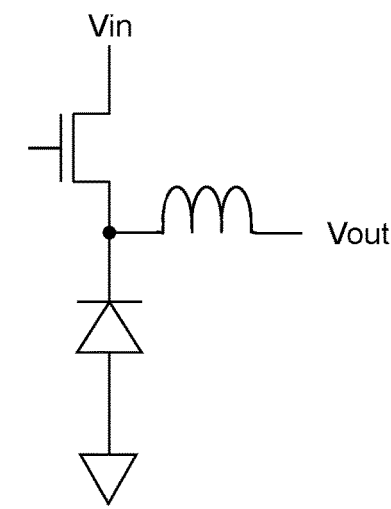
【Fig. 6B】
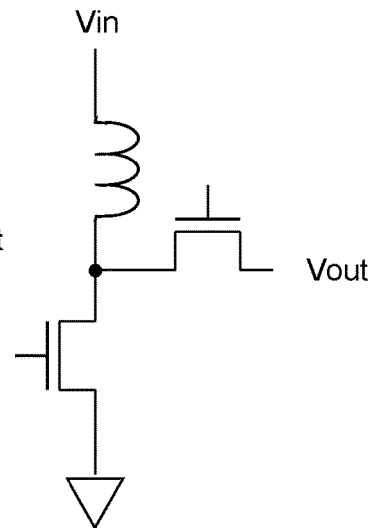
【Fig. 6C】
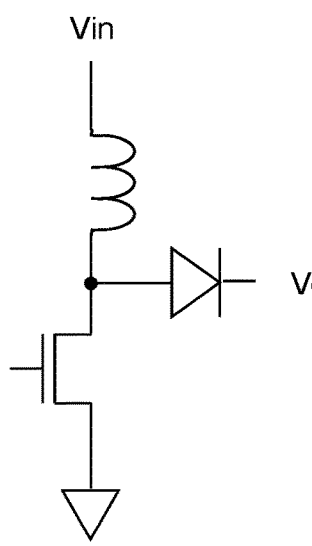
【Fig. 6D】
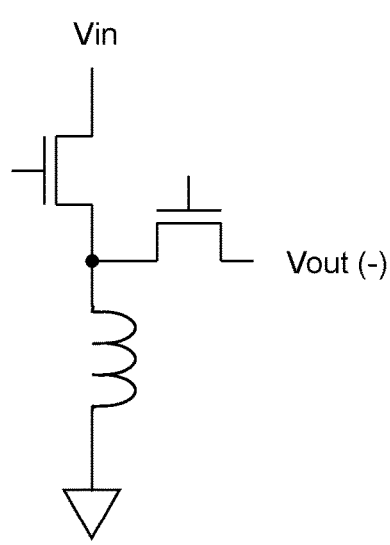
【Fig. 6E】
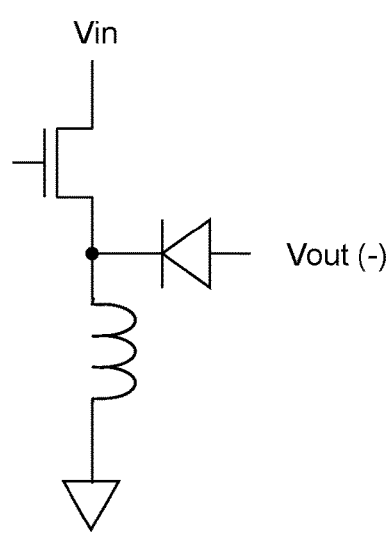
【Fig. 6F】

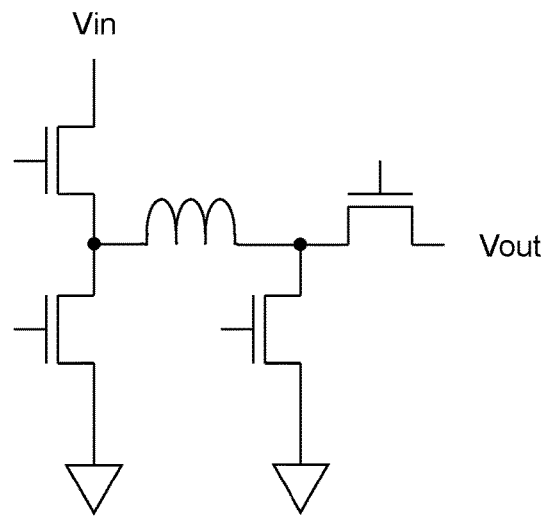
【Fig. 6G】
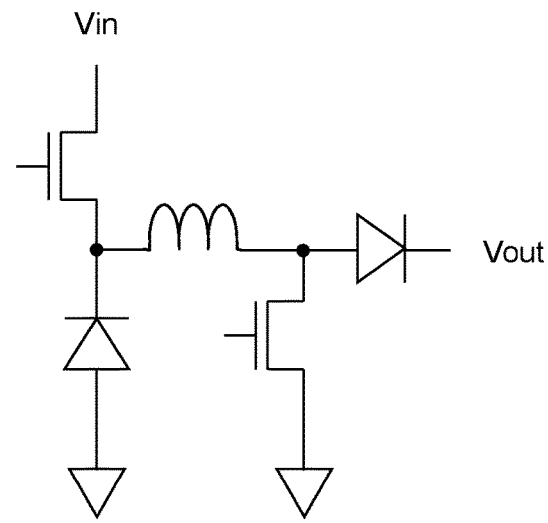
【Fig. 6H】
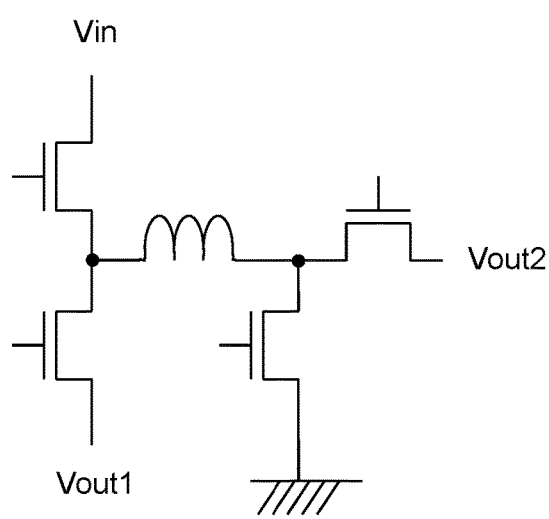
【Fig. 6I】
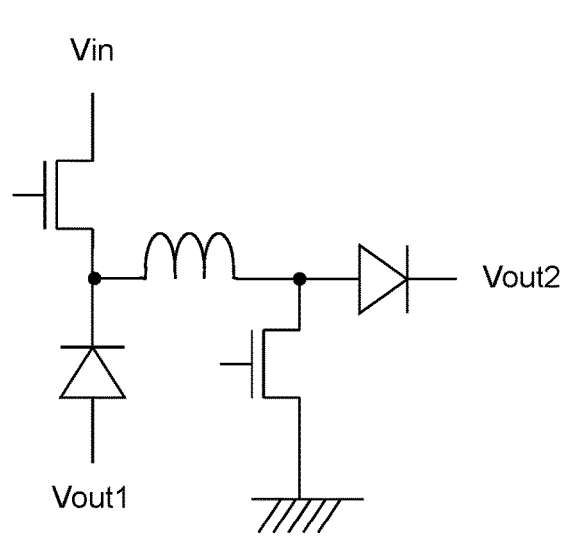
【Fig. 6J】

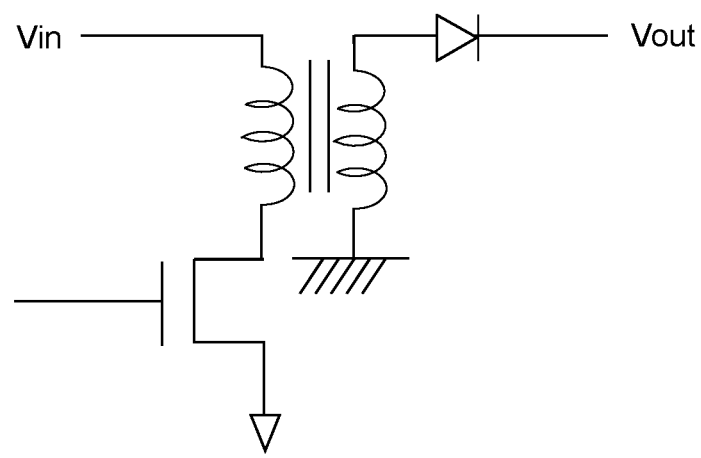
【Fig. 6K】

POWER CONVERSION CIRCUIT HAVING SHORT-CIRCUIT DETECTION FUNCTION AND SHORT-CIRCUIT DETECTION METHOD THEREOF

BACKGROUND OF THE INVENTION

Field of Invention

The present invention relates to a power conversion circuit which can detect short-circuit conditions. The present invention also relates to a short-circuit detection method for use in the power conversion circuit for short-circuit detection.

Description of Related Art

U.S. Pat. No. 10,483,755 adopts a different approach from the present invention for short-circuit detection.

For display panels, manufacturing defects or aged parts, either on chips or printed circuit boards, may lead to short-circuit or large leakage problems, which can cause serious damage on the chips, printed circuit boards, or the whole display device itself. To prevent this, many prior art display panels adopt short-circuit protection schemes for the period when the display is being started up to normal operating condition.

FIG. 1A and FIG. 1B show a prior art power conversion circuit (short-circuit detection circuit 100) having short-circuit detection function (U.S. Pat. No. 10,483,755) and a flowchart thereof. As shown in FIG. 1A and FIG. 1B, in step S100, the voltage converter 1 provides a first driving voltage DV1 at a first output electrode during a short detection period Tsd. In step S200, a comparator 210 is configured to determine whether a magnitude of a second driving voltage DV2 of a second output electrode exceeds a magnitude of a reference voltage Vref. When DV2 is higher than Vref, it indicates the resistance between the first output electrode and the second output electrode is lower than a short-circuit resistance threshold. A shut down operation can be performed therein. On the other hand, if the magnitude of the second output electrode does not exceed the magnitude of a reference voltage Vref, a second driving voltage DV2 with an operational level is provided by the voltage converter 2 at the second output electrode after the short detection period Tsd.

In this proposal, a new short-circuit detection scheme is presented which utilizes the property of operating frequency of power supply circuit in a display panel proportional to the leakage current between the supply rails in the panel. By using a simple digital circuits, it detects the amount of the leakage current and shuts down the power supply circuit whenever needed to avoid the whole system damage.

Compared to the prior art, the proposed art does not employ analog circuits for short-circuit detection. It can be implemented purely with digital circuitry using a pulse counter and several digital gates. As a result, circuit area can be saved and reliability can be improved. Moreover, the short-circuit detection level can be easily adjusted by simple digital programming.

SUMMARY OF THE INVENTION

From one perspective, the present invention provides a power conversion circuit, including: a first power converter, configured to operably generate a first driving voltage; and a second power converter, including at least one switch for switching an inductor to generate a second driving voltage; wherein in an operating mode, the first driving voltage and the second driving voltage are regulated to a first driving level and a second driving level respectively as supply rails for driving a load; wherein in a short-circuit detection mode, the first driving voltage is regulated to the first driving level, and the second power converter is configured to operate in a pulse frequency modulation mode to regulate the second driving voltage to a short-circuit detection level, and when a switching frequency of the second power converter exceeds a threshold frequency, a short-circuit condition between the second driving voltage and the first driving voltage is determined; wherein the switching frequency relates to a leakage current between the second driving voltage and the first driving voltage, and a load current consumed by the load is less than a predetermined level in the short-circuit detection mode.

In one preferred embodiment, the switching frequency is proportional to the leakage current or proportional to the leakage current plus an offset current, wherein the offset current is consumed by the second power converter from the second driving voltage for generating the second driving voltage.

In one preferred embodiment, in the short-circuit detection mode, a first switch of the at least one switch of the second power converter switches with a constant ON time switching scheme in the short-circuit detection mode.

In one preferred embodiment, in the short-circuit detection mode, the second power converter operates in a discontinuous conduction mode.

In one preferred embodiment, the second power converter includes: a power stage circuit, including a first switch and a second switch which are configured to switch the inductor for generating the second driving voltage in the operating mode; a switching control circuit, configured to generate a control signal to control the first switch and the second switch according to a difference between the second driving voltage and a reference voltage; and a frequency detection circuit, configured to operably measure a switching frequency of the control signal in the short-circuit detection mode to determine whether the switching frequency exceeds a threshold frequency or not, so as to determine whether the short-circuit condition occurs.

In one preferred embodiment, in the short-circuit detection mode, the second switch is controlled to be off, such that the second power converter operates in an asynchronous mode, wherein at least a portion of a current of the inductor flows through a body diode of the second switch.

In one preferred embodiment, the power stage further includes a third switch, wherein in the short-circuit detection mode, the third switch is controlled to be off, wherein in the operating mode, the second switch and the third switch are configured to operably switch the inductor for generating the second driving voltage to the second driving level.

In one preferred embodiment, in the operating mode, the first switch is controlled to be off, wherein the second switch and the third switch are controlled to switch with pulse width modulation to generate the second driving voltage to the second driving level.

In one preferred embodiment, the first switch is connected between the first driving voltage and one end of the inductor, wherein in the short-circuit detection mode, the second driving voltage regulated to the short-circuit detection level is converted from the first driving voltage through switching the first switch.

In one preferred embodiment, the first switch is connected between the first driving voltage and a switching node, the second switch is connected between the switching node and the second driving voltage, the third switch is connected between an input voltage and the switching node, and the inductor is connected between the switching node and a ground node, such that the second power converter is configured as a buck-boost DC-DC converter.

In one preferred embodiment, the switching control circuit includes: a comparison circuit, configured to operably compare the second driving voltage with a reference voltage to generate a comparison output signal; and a pulse frequency modulation circuit, configured to operably modulates the comparison output signal with a clock signal having a constant pulse width to generate the control signal in the short-circuit detection mode, so as to control the first switch to operate in the pulse frequency modulation mode.

In one preferred embodiment, the frequency detection circuit counts a pulse number of the control signal within a predetermined period of time to measure the switching frequency of the control signal.

In one preferred embodiment, a magnitude of the short-circuit detection level is smaller than a magnitude of the second driving level.

From another perspective, the present invention provides a short-circuit detection method for use in detecting a short-circuit condition between a first driving voltage and a second driving voltage, wherein the second driving voltage is generated by controlling at least one switch for switching an inductor; wherein in an operating mode, the first driving voltage and the second driving voltage are regulated to a first driving level and a second driving level respectively as supply rails for driving a load; wherein the short-circuit detection method performed in a short-circuit detection mode comprising: regulating the first driving voltage to the first driving level; controlling the at least one switch to operate in a pulse frequency modulation mode to regulate the second driving voltage to a short-circuit detection level; and detecting the short-circuit condition by determining whether a switching frequency of the at least one switch exceeds a threshold frequency; wherein the switching frequency relates to a leakage current between the second driving voltage and the first driving voltage, and a load current consumed by the load is less than a predetermined level in the short-circuit detection mode.

In one preferred embodiment, the switching frequency is proportional to the leakage current or proportional to the leakage current plus an offset current, wherein the offset current is consumed from the second driving voltage by operating the at least one switch for generating the second driving voltage.

In one preferred embodiment, in the short-circuit detection mode, a first switch of the at least one switch switches with a constant ON time switching scheme in the short-circuit detection mode.

In one preferred embodiment, in the short-circuit detection mode, the at least one switch operates the inductor in a discontinuous conduction mode.

In one preferred embodiment, the at least one switch including a first switch and a second switch which are configured to switch the inductor for generating the second driving voltage in the operating mode, wherein the step of controlling the at least one switch includes: generating a control signal to control the first switch and the second switch according to a difference between the second driving voltage and a reference voltage; and measuring a switching frequency of the control signal in the short-circuit detection mode to determine whether the switching frequency exceeds a threshold frequency or not, so as to determine whether the short-circuit condition occurs.

In one preferred embodiment, the step of controlling the at least one switch further includes: operating the first switch and the second switch in an asynchronous mode by controlling the second switch to be off, wherein at least a portion of a current of the inductor flows through a body diode of the second switch.

In one preferred embodiment, the at least one switch further includes a third switch, wherein in the short-circuit detection mode, the third switch is controlled to be off, wherein in the operating mode, the second switch and the third switch are configured to operably switch the inductor for generating the second driving voltage to the second driving level.

In one preferred embodiment, in the operating mode, the first switch is controlled to be off, wherein the second switch and the third switch are controlled to switch with pulse width modulation to generate the second driving voltage to the second driving level.

In one preferred embodiment, the step of generating a control signal includes: comparing the second driving voltage with a reference voltage to generate a comparison output signal; and modulating the comparison output signal with a clock signal having a constant pulse width to generate the control signal in the short-circuit detection mode, so as to control the first switch to operate in the pulse frequency modulation mode.

In one preferred embodiment, the step of measuring a switching frequency includes: counting a pulse number of the control signal within a predetermined period of time to measure the switching frequency of the control signal.

In one preferred embodiment, a magnitude of the short-circuit detection level is smaller than a magnitude of the second driving level.

The objectives, technical details, features, and effects of the present invention will be better understood with regard to the detailed description of the embodiments below, with reference to the attached drawings.

BRIEF DESCRIPTION OF THE DRAWINGS

FIG. 6A—FIG. 6K show various topologies which are suitable for implementing the power stage circuit of the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
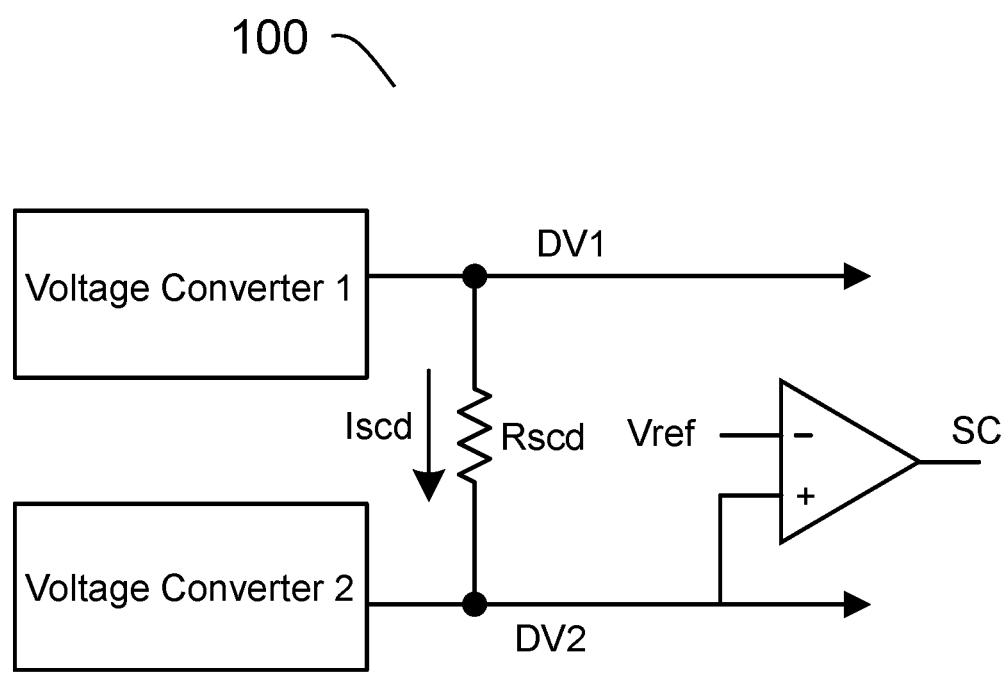
FIG. 1A shows a prior art short-circuit detection circuit.
Figure 1B:
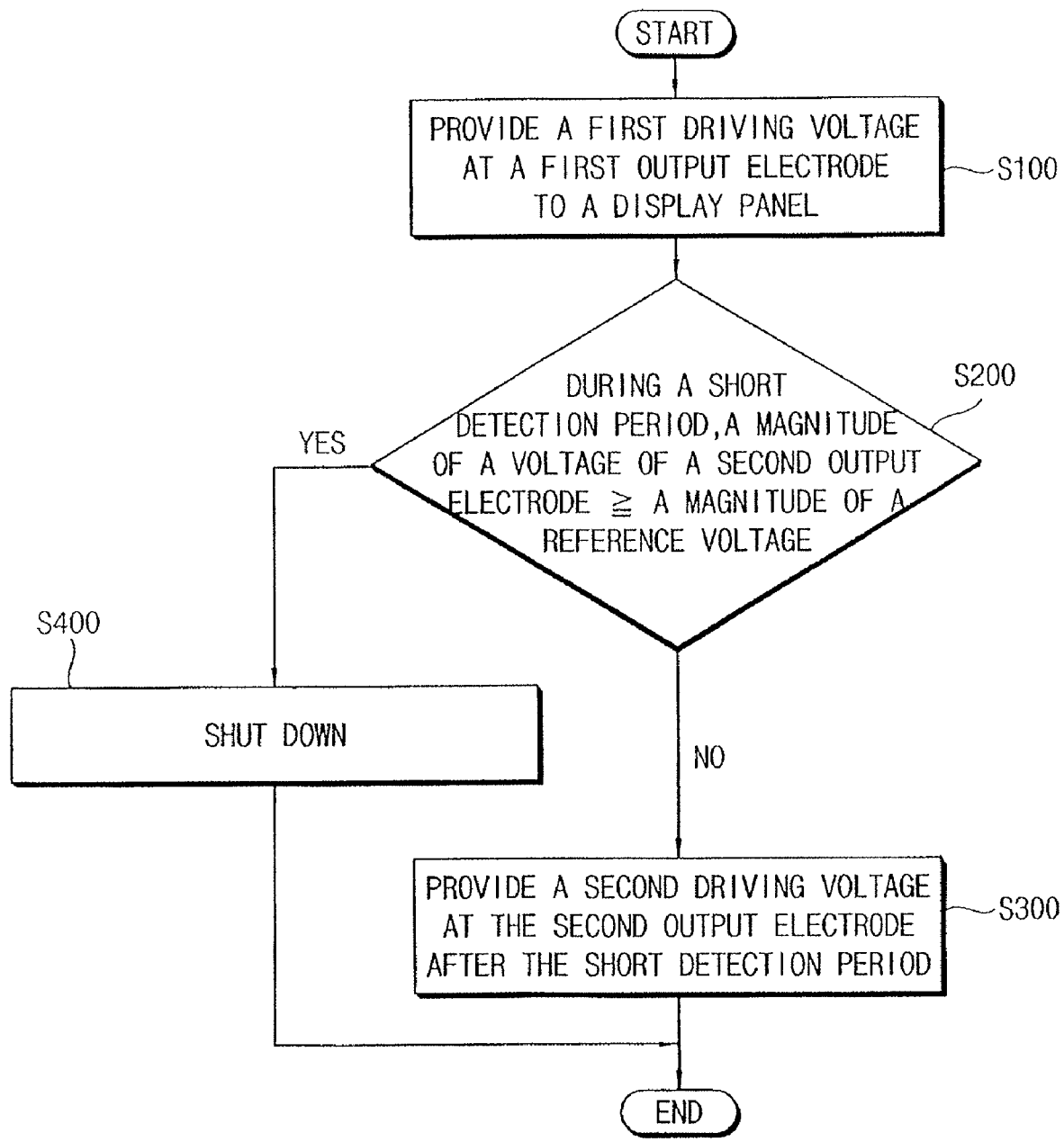
FIG. 1B shows a flow chart corresponding to the prior art short-circuit detection circuit in FIG. 1A.
Figure 1C:
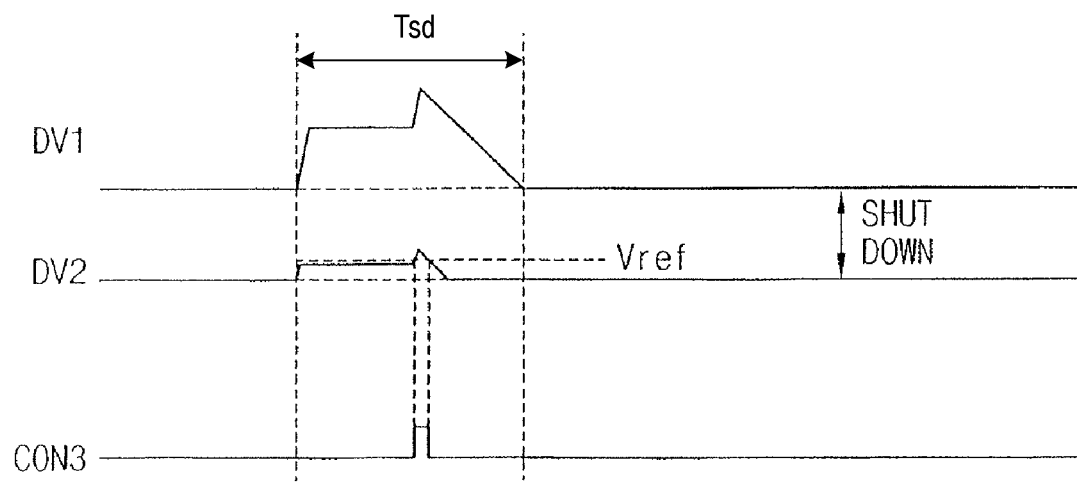
FIG. 1C shows operation waveforms corresponding to the prior art short-circuit detection circuit in FIG. 1A and FIG. 1B.
Figure 2:
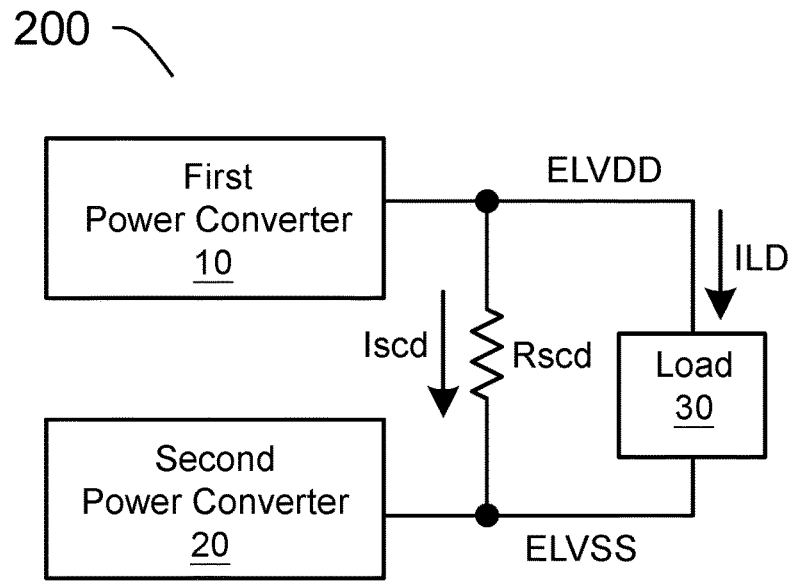
FIG. 2 shows a block diagram of a power conversion circuit having short-circuit detection function according to an embodiment of the present invention.
Figure 3:
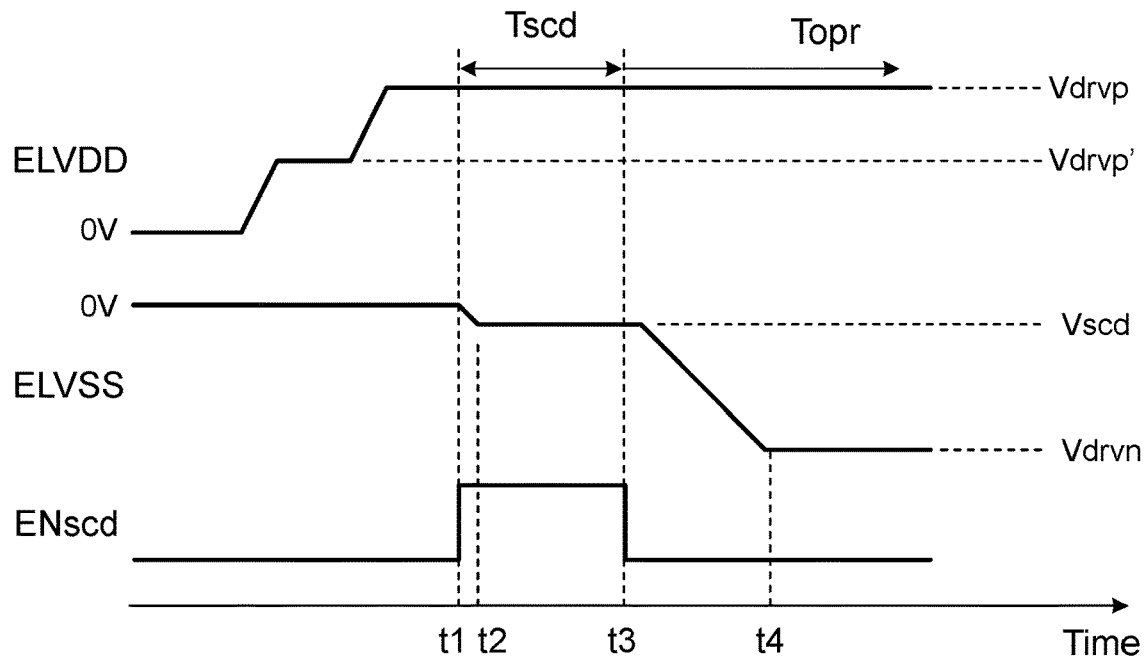
FIG. 3 shows operating waveforms according to an exemplary embodiment of the present invention.

FIG. 2 shows a block diagram of a power conversion circuit having short-circuit detection function according to an embodiment of the present invention. FIG. 3 shows operating waveforms according to an exemplary embodiment of the present invention. In one embodiment, the power conversion circuit 200 includes a first power converter 10 and a second power converter 20 which are configured to operably generate a driving voltage ELVDD and a driving voltage ELVSS respectively. In one embodiment, the driving voltages ELVDD and ELVSS can be employed as supply rails for driving a load 30 which can be for example an OLED display panel. The load current consumed by the load 30 is noted as ILD. In one particular embodiment, during the operating period Topr, the driving voltage ELVDD is a positive voltage (e.g. Vdrvp) and the driving voltage ELVSS is a negative voltage (e.g. Vdrvn). During the operating period Topr, the load current ILD can be a non-zero value.

In a non-limiting embodiment, as shown in FIG. 3, after the driving voltage ELVDD start-up is finished (e.g. t1), and the driving voltage ELVDD is regulated at a predetermined driving level Vdrvp, the driving voltage ELVSS starts up and is regulated to a predetermined short-circuit detection level Vscd (e.g. t2), during a short circuit detection period Tscd for short-circuit detection. In one embodiment, during the short circuit detection period Tscd, the load 30 can be configured not to consume power. In other words, the load current ILD can be zero during the short circuit detection period Tscd.

In one embodiment, before the short circuit detection period Tscd, the driving voltage ELVDD ramps up to a level Vdrvp' first and ramps up to the driving level Vdrvp subsequently.

As shown in FIG. 2, a leakage resistor 40 having a leakage resistance Rscd is adopted herein for modeling any possible leakage current path existing between the driving voltage ELVDD and the driving voltage ELVSS other than the load 30. If there is a finite impedance between the driving voltage ELVDD and the driving voltage ELVSS, a leakage current flows from the driving voltage ELVDD to the driving voltage ELVSS, as noted as Iscd in FIG. 2.

The second power converter 20 is a switching power converter according to this invention. The second power converter 20 can be configured as any of the power converter topologies as shown in FIG. 6A-FIG. 6K, for example buck converter, boost converter, buck-boost converter, inverting buck-boost and flyback converter. The power converter 20 includes at least a switch for switching an inductor to convert an input voltage Vin to an output power Vout (corresponding to ELVSS).

In one embodiment, during the short-circuit detection period Tscd, the second power converter 20 is configured to operate in pulse frequency modulation mode (PFM), wherein the switching frequency of the second power converter 20 operating in PFM is referred to as Fpf. The switching frequency Fpf is related to the magnitude of the leakage current Iscd.

In one particular embodiment, the leakage current Iscd is proportional to the magnitude of the leakage current Iscd because the second power converter 20 has to provide or draw the same amount of current as the leakage current Iscd in order to maintain its output voltage at Vscd. As a result, the magnitude of the leakage resistance Rscd can be estimated by using a frequency detection circuit. From another perspective, in this embodiment, the switching frequency Fpf is inversely proportional to the leakage resistance Rscd. Using the properties described herein, the short-circuit condition can be detected by comparing the switching frequency Fpf with a predetermined threshold frequency Fth.

Figure 4:
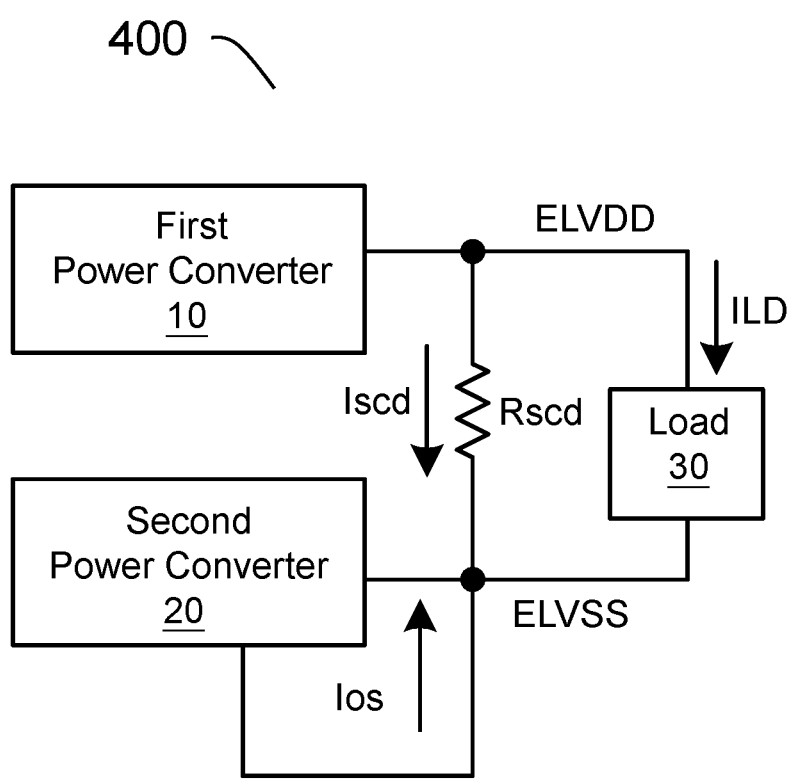
FIG. 4 shows a block diagram of a power conversion circuit having short-circuit detection function according to an embodiment of the present invention.

FIG. 4 shows a block diagram of a power conversion circuit 400 having short-circuit detection function according to an embodiment of the present invention. In practice, the second power converter 20 can provide or consume a certain current to its output, as noted as Ios in FIG. 4. More specifically, the offset current Ios is the current consumed by the circuitry operating inside the second power converter 20 for generating the driving voltage ELVSS. In this embodiment, the switching frequency Fpf of the second power converter 20 is inversely proportional to the leakage resistance Rscd with an offset which is proportional to the offset current Ios. Thus, whether there is a short-circuit condition can still be detected by measuring and comparing the switching frequency Fpf with a threshold frequency Fth which is corresponded to a threshold current related to the predetermined leakage resistance Rscd threshold plus the offset current Ios.

Figure 5:
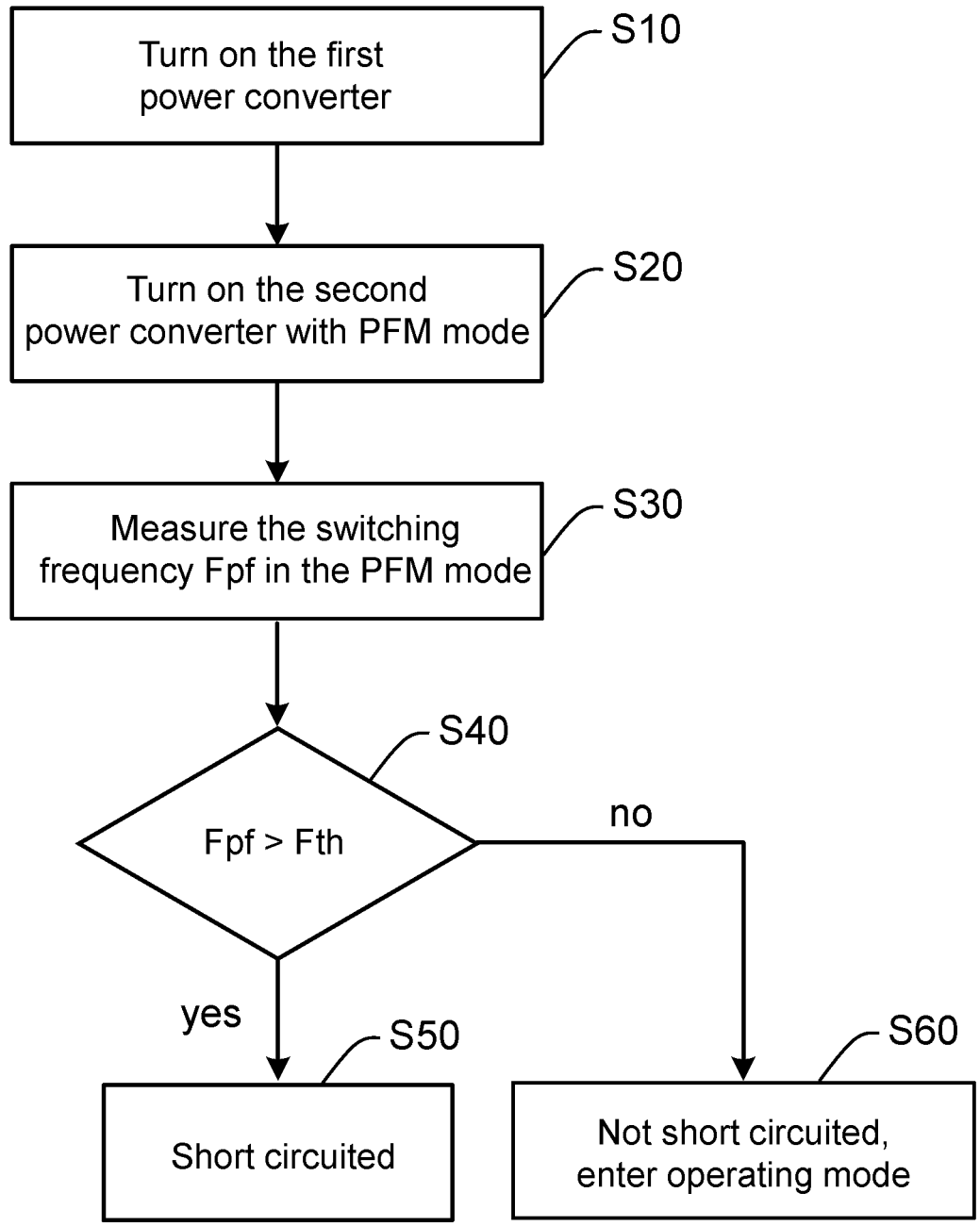
FIG. 5 shows a flowchart for short-circuit detection corresponding to FIG. 2-FIG. 4 according to the present invention.

The flowchart for short-circuit detection corresponding to FIG. 2 and FIG. 4 is shown in FIG. 5. In one embodiment, during the short-circuit detection period Tscd, the first power converter 10 is turned on first in step S10, and subsequently the second power converter 20 is turned on in PFM mode in step S20. Then, the switching frequency Fpf is measured in step S30 and is compared with a predetermined threshold frequency Fth in step S40. When the measured switching frequency Fpf exceeds (e.g. larger than) the threshold frequency Fth, a short-circuit condition is detected as in step S50. When the measured switching frequency Fpf does not exceed the threshold frequency Fth, the power conversion circuit is judged as not short circuited, as in step S60. In one embodiment, an operating mode can be further entered subsequently in step S60.

In one particular embodiment, the first power converter 10 is a boost DC-DC converter configured to generate the driving voltage ELVDD, and the second power converter 20 is an inverting buck-boost DC-DC converter configured to generate the driving voltage ELVSS. Typical boost DC-DC converter and buck-boost DC-DC converter can be referred to in FIG. 6C and FIG. 6E respectively.

Figure 7:
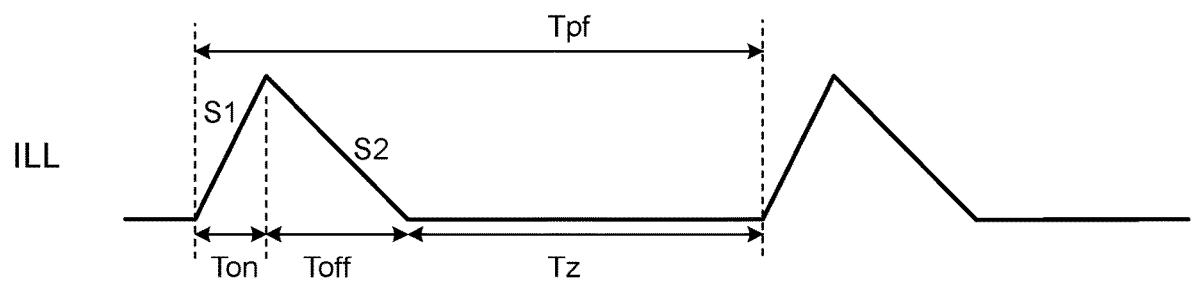
FIG. 7 shows operating waveforms of one embodiment of the power converter operating in PFM according to the present invention.

FIG. 7 shows operating waveforms of one embodiment of the second power converter 20 operating in PFM according to the present invention. Please also refer to FIG. 9 which shows a schematic diagram of the power converter according to an embodiment of the present invention. In one embodiment, in the short-circuit detection mode, the second power converter 20 operates in DCM (discontinuous conduction mode) with a constant on time Ton. Note that when operating in DCM with a constant on time Ton, the switching frequency is proportional to the average inductor current which is equal to the output current of the power converter 20 (i.e. ILD plus Iscd). As shown in FIG. 7, during Ton, the inductor current ILL ramps up with a slope S1 which is equal to Vins/L. During Toff, the inductor current ILL ramps down with a slope S2 which is equal to |Vscd|/L. During Tz, the inductor ILL is zero. The cycle period Tpf=1/Fpf=Ton+Toff+Tz.

Figure 9:
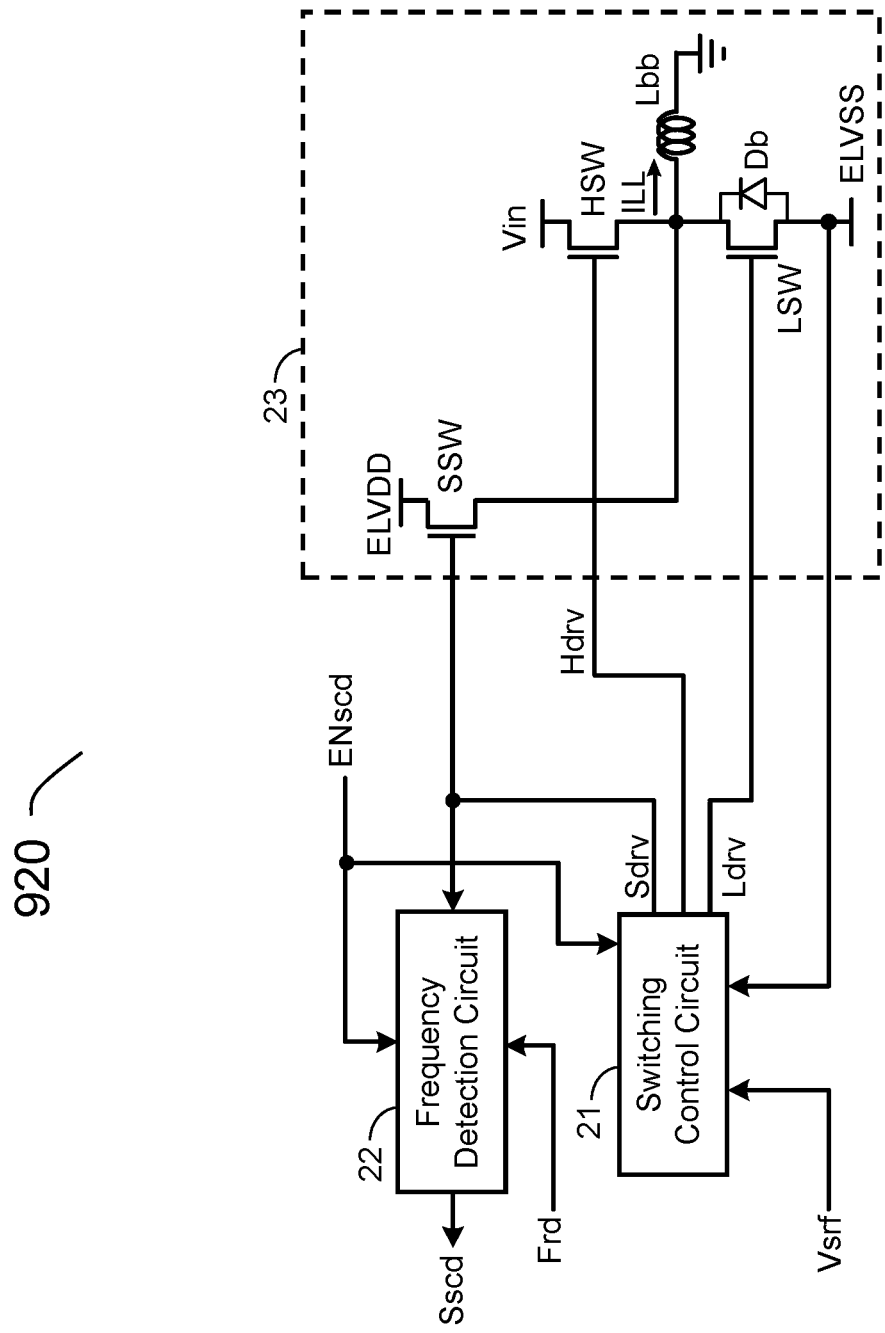
FIG. 9 shows a schematic diagram of the power converter according to an embodiment of the present invention.

Thus, a mathematical equation 1 for the switching frequency Fpf of the second power converter 20 is derived as:

$$Fpf = (Ios + Iscd)\frac{2L}{Ton^2}\frac{|Vscd|}{Vins^2}$$
$$= \left(Ios + \frac{Vdrvp - Vscd}{Rscd}\right)\frac{2L}{Ton^2}\frac{|Vscd|}{Vins^2}$$

wherein L is the inductance of inductor Lbb (as shown in FIG. 9) of the second power converter 20, Ton is the pulse width of the PFM pulse of the second power converter 20, and Vins is the power supply of the second power converter 20.

In one preferred embodiment, the driving voltage ELVDD is employed as the supply power of the second power converter 20, as shown in FIG. 9, so that the power supply of the second power converter 20 can be a fixed value. Thus, Vins can be replaced by Vdrvp and the equation 2 is obtained as below:

$$Fpf = \left(Ios + \frac{Vdrvp - Vscd}{Rscd}\right)\frac{2L}{Ton^2}\frac{|Vscd|}{Vdrvp^2}$$

Provided all variables on the right side of equation 2 are constant except Rscd, the switching frequency Fpf depends on only the leakage resistance Rscd. As described earlier, in this embodiment, the switching frequency Fpf is inversely proportional to the leakage resistance Rscd, as equation 2 indicates.

Hence, a threshold frequency Fth of the switching frequency Fpf can be derived from a leakage resistance threshold of the leakage resistor Rscd for detecting the short-circuit condition.

Figure 8:
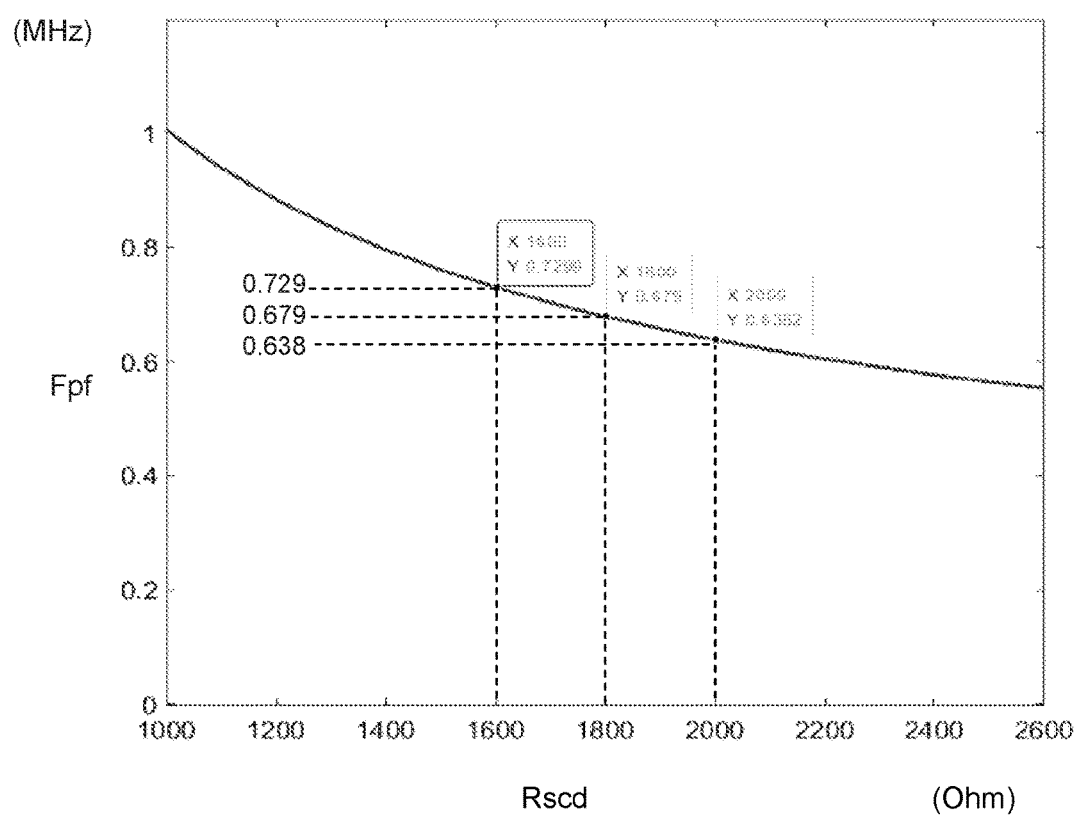
FIG. 8 shows a characteristic diagram of the switching frequency with respect to the leakage resistance according to one embodiment of the present invention.

FIG. 8 shows a characteristic diagram of the switching frequency Fpf with respect to the leakage resistance Rscd. Variables Vdrv, Vscd, L, Ton, Ios are configured to be 4.6V, −0.8V, 2.2 nH, 35 ns, and 2 mA, respectively, in this embodiment. Obviously, the switching frequency Fpf is inversely proportional to the leakage resistance Rscd, as shown in FIG. 8, and its sensitivity on the leakage resistance Rscd is quite noticeable, which is beneficial for higher short-circuit detection accuracy. As a non-limiting exemplary embodiment, the target leakage resistance Rscd for short-circuit detection can be selected as 1.8 kOhm, the corresponding threshold frequency Fth is 679 kHz. Thus, when the measured switching frequency Fpf is higher than threshold frequency Fth (679 kHz), the outputs of the first power converter 10 and the second power converter 20, i.e. the driving voltages ELVDD and ELVSS, are determined to be short-circuited.

Referring to FIG. 9, the second power converter 920 for example is corresponded to the second power converter 20 shown in FIG. 2. In one embodiment, the second power converter 920 includes a switching control circuit 21, a frequency detection circuit 22 and a power stage circuit 23.

Please refer to FIG. 9 and FIG. 3. The reference voltage Vsfr is adjustable and is controlled by the mode control signal ENscd. More specifically, in the short-circuit detection mode (e.g. ENscd is enabled corresponding to the short-circuit detection period Tscd shown in FIG. 3), the reference voltage Vsfr is configured to be at or related to the short-circuit detection level Vscd, while in the operating mode (e.g. ENscd is disabled corresponding to the operating period Topr shown in FIG. 3), the reference voltage Vsfr is configured to be at or related the driving level Vdrvn. In one embodiment, the magnitude of the short-circuit detection level Vscd is smaller than the magnitude of the driving level Vdrvn, such that the aforementioned threshold frequency Fth is lower, compared to being regulated to the driving level Vdrvn, so that the sensitivity for short-circuit detection can be improved.

In this embodiment, the power stage circuit 23 is configured as a buck-boost DC-DC converter and includes a first high side switch HSW, a second high side switch SSW and a low side switch LSW. More specifically, the first high side switch HSW is connected between the input voltage Vin and a switching node LX. The low side switch LSW is connected between the switching node LX and the driving voltage ELVSS. The second high side switch is connected between a regulated voltage and the switching node LX. The inductor Lbb is connected between the switching node LX and a ground node. In a non-limiting embodiment, these switches can be MOSFETs.

In one preferred embodiment, one terminal of the second high side switch SSW is connected to the driving voltage ELVDD (corresponding to the aforementioned regulated voltage) in the short-circuit detection mode to regulate the driving voltage ELVSS to the short-circuit detection level Vscd, which leads to more consistent dependency between the switching frequency Fpf and the leakage current Iscd.

The switching control circuit 21 is configured to generate control signals Hdrv, Sdrv and Ldrv for controlling the switches HSW, SSW and LSW according to the reference voltage Vsfr, the driving voltage ELVSS and the mode control signal ENscd.

In one embodiment, in the operating mode, the first high side switch HSW and the low side switch LSW are controlled to switch the inductor Lbb to generate the driving voltage ELVSS to the driving level Vdrvn, wherein the second high side switch SSW is controlled to be off. In the short-circuit detection mode, the second high side switch SSW is controlled to switch the inductor Lbb to generate the driving voltage ELVSS to the short-circuit detection level, wherein the first high side switch HSW and the low side switch LSW are controlled to be off. Details are described hereinafter.

When the mode control signal ENscd is disabled for the operating mode (Topr), the switching control circuit 21 controls the first high side switch HSW and the low side switch LSW to switch the inductor Lbb to regulate the driving voltage ELVSS to the driving level Vdrvn, so as to drive the load 30 in association with the driving voltage ELVDD. In one embodiment, the second high side switch SSW can be off in the operating mode.

When the mode control signal ENscd is enabled for the short-circuit detection mode (Tscd), the switching control circuit 21 controls the second high side switch SSW to switch in the PFM mode to regulate the driving voltage ELVSS to the short-circuit detection level Vscd, wherein the switching frequency Fpf is proportional to the leakage current Iscd, or proportional to the leakage current Iscd plus the offset current Ios, as described hereinbefore.

In one embodiment, the physical dimension (for example the ratio of the width and the length) of the second high side switch SSW is relatively smaller than the first high side switch HSW. Consequently, the switching loss of the second high side switch SSW is relatively low, particularly at lower output current level of the driving voltage ELVSS. In one preferred embodiment, in the short-circuit detection mode, the first high side switch HSW is controlled to be off, so as to reduce power consumption due to switching loss of the first high side switch HSW, which can lead to higher accuracy of the short-circuit detection due to lower offset current Ios by not switching the first high side switch HSW.

In one embodiment, in the short-circuit detection mode, the low side switch LSW can also be off. In this case, a body diode Db of the low side switch LSW operates in association with the second high side switch SSW as an asynchronous buck-boost DC-DC converter, which leads to lower power consumption and higher accuracy of the short-circuit detection due to lower power loss by not switching the low side switch LSW.

In one embodiment, in the short-circuit detection mode, the second power converter 20 operates in DCM for achieving the pulse frequency modulation, for example as shown in FIG. 7. Thus, in addition to power saving, operating the second power converter 20 in the asynchronous mode by turning off the low side switch LSW can further simplify the circuit design due to the fact that the second power converter 20 does not necessitate the use of a zero-crossing detection (ZCD).

In the short-circuit detection mode, the frequency detection circuit 22 is configured to measure the PFM switching frequency Fpf according to the control signal Sdrv, and determine whether the measured switching frequency Fpf exceeds the threshold frequency Fth or not for detecting the short-circuit condition. In one embodiment, the detection output signal Sscd is enabled to represent the short-circuit condition. In one embodiment, when the short-circuit condition is detected, the detection output signal Sscd can control the first power converter 10 and the second power converter 20 and other necessary circuitry to shut down.

Figure 10:
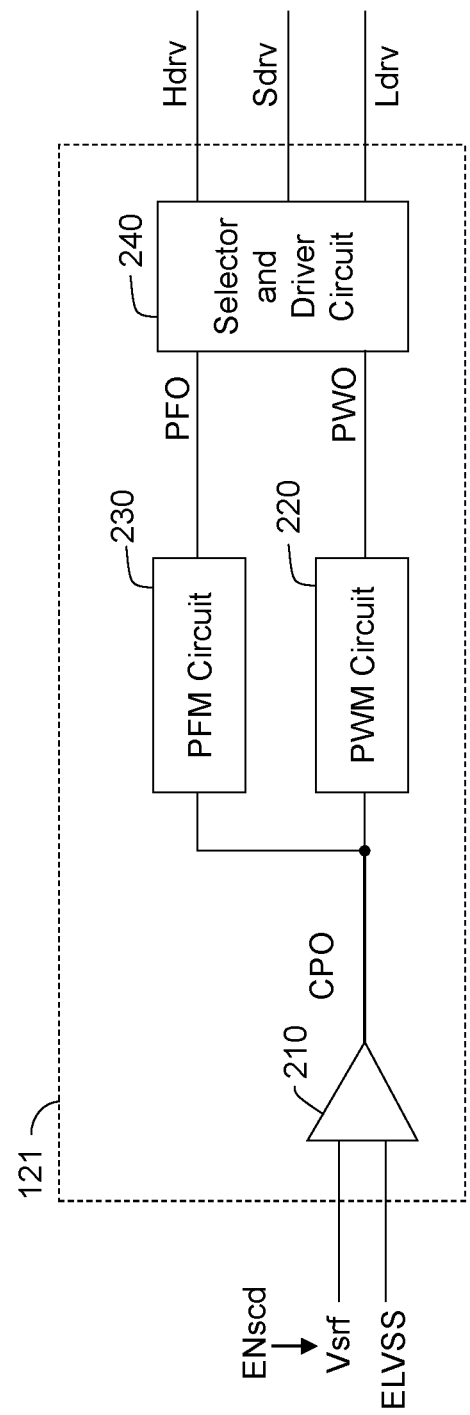
FIG. 10 shows a schematic diagram of the switching control circuit according to an embodiment of the present invention.

FIG. 10 shows a schematic diagram of the switching control circuit according to an embodiment of the present invention. The switching control circuit 121 for example is corresponded to the switching control circuit 21 shown in FIG. 9. In one embodiment, the switching control circuit 121 includes a comparison circuit 210, a pulse width modulation (PWM) circuit 220, a pulse frequency modulation (PFM) circuit 230 and a selector and driver circuit 240. The comparison circuit 210 compares the driving voltage ELVSS to the reference voltage Vsfr to generate a comparison output signal CPO.

In the short-circuit detection mode, the PFM circuit 230 generates the PFM signal PFO with pulse frequency modulation according to the comparison output signal CPO, and the selector and driver circuit 240 controls the control signal Sdrv according to the PFM signal PFO to switch the second high side switch SSW. The selector and driver circuit 240 also controls the control signals Hdrv and Ldrv to control both the first high side switch HSW and the low side switch LSW to be off in the short-circuit detection mode.

In one embodiment, in the operating mode, the PFM circuit 230 generates the PWM signal PWO with pulse width modulation according to the comparison output signal CPO, and the selector and driver circuit 240 controls the control signals Hdrv and Ldrv according to the PWM signal PWO to switch the first high side switch SSW and the low side switch LSW respectively. The selector and driver circuit 240 also controls the control signal Sdrv to control the second high side switch SSW to be off in the operating mode.

Figure 11:
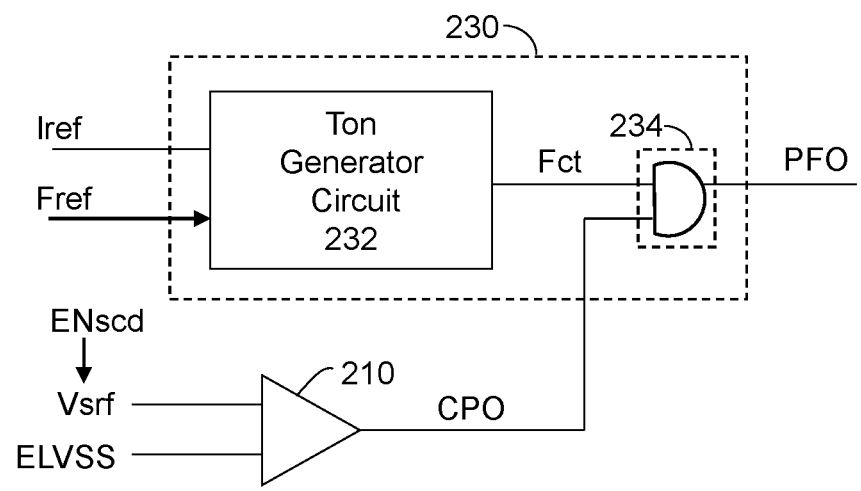
FIG. 11 shows a schematic diagram of the PFM circuit according to one specific embodiment of the present invention.

FIG. 11 shows a schematic diagram of the PFM circuit according to one specific embodiment of the present invention. In one embodiment, the PFM circuit 230 includes a Ton generator circuit 232 and a multiplier circuit 234. The Ton generator circuit 232 is configured to generate a COT (constant on time) clock signal Fct which has a fixed pulse width according to a reference clock signal Fref. In one embodiment, the reference clock signal Fref can have a fixed frequency, and the pulse width (i.e. the ON time Ton) can be adjusted to be fixed according to a reference current Iref.

The multiplier circuit 234 multiplies the COT clock signal Fct with the comparison output signal CPO to generate the PFM signal PFO with pulse frequency modulation. In one embodiment, the multiplier circuit 234 includes an AND gate. In the short-circuit detection mode, the AND gate enables the COT clock signal Fct when the voltage level of the driving voltage ELVSS does not exceed the target short-circuit detection level Vscd (e.g. when CPO is high), so as to turn on the second high side switch SSW for increasing the inductor current ILL. On the other hand, the AND gate masks the COT clock signal Fct when the voltage level of the driving voltage ELVSS exceeds the target short-circuit detection level Vscd (e.g. when CPO is low), so as to turnoff the second high side switch SSW for decreasing the inductor current ILL. Consequently, the driving voltage ELVSS will be regulated at the short-circuit detection level Vscd and the frequency of the pulses of the PFM signal PFO will be proportional to the leakage current Iscd in the short-circuit detection mode.

Figure 12:
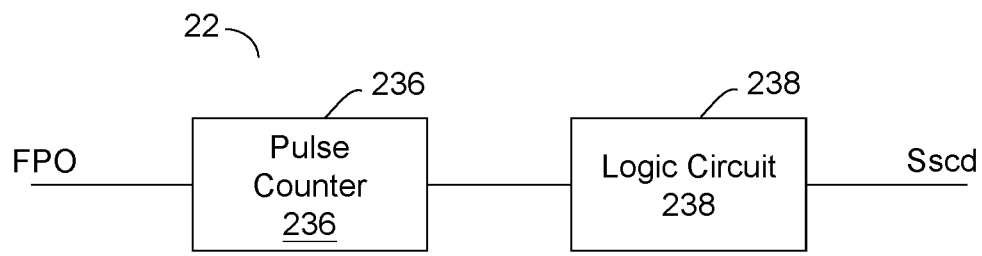
FIG. 12 shows a schematic diagram of the frequency detection circuit according to one specific embodiment of the present invention.

FIG. 12 shows a schematic diagram of the frequency detection circuit according to one specific embodiment of the present invention. In one embodiment, the frequency detection circuit 22 includes a pulse counter 236 and a logic circuit 238. In one embodiment, the pulse counter 236 can count the number of the pulses of the PFM signal PFO within a predetermined period of time. The ratio of the count number generated by the pulse counter 236 to the predetermined period of time represents the average frequency of the switching frequency Fpf. The logic circuit 238 compares the count numbers obtained by the pulse counter 236 to a threshold count corresponding to the aforementioned threshold frequency Fth to determine whether a short-circuit condition occurs. Since the short-circuit detection is performed in digital domain, the threshold frequency Fth can be adjusted easily by simple software programming.

It is noteworthy that, from one perspective, the frequency detection circuit 22 determines the switching frequency Fpf by measuring the pulse density within a predetermined period of time.

In one embodiment, the power conversion circuit as shown in FIG. 9 can be simplified by removing the second high side switch SSW. In this alternative case, in the short-circuit detection mode, the first high side switch HSW can be operated in pulse frequency modulation by the control signal Hdrv according to the PFM signal PFO (as shown in FIG. 10) to generate the driving voltage ELVSS to the level of Vscd, and the relationship between the frequency of the driving signal Hdrv and the leakage current Iscd is still the same as the operation described hereinbefore.

It is noteworthy that the idea of the proposed short-circuit detection scheme can be applied to the case where the driving voltage ELVSS is turned on first and then the driving voltage ELVDD is turned on subsequently to a predetermined target value as opposed to FIG. 3 and FIG. 5. In this case, in the short-circuit detection mode, the first power converter 10 in the aforementioned PFM mode can detect the short-circuit condition according to the switching frequency of the first power converter 10.

The concept of the invention was illustrated in buck-boost converter as shown in FIG. 9. However, other converter topologies, for example as shown in FIG. 6A-FIG. 6K can also adopt the aforementioned short-circuit detection function. Considering the current/voltage waveform difference among different types of DC-DC converters, the resulting equation of the PFM switching frequency Fpf is different from the aforementioned equations accordingly. However, the property of PFM frequency being related or proportional to the leakage current still holds true.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A power conversion circuit, comprising:
   a first power converter, configured to operably generate a first driving voltage; and
   a second power converter, including at least one switch for switching an inductor to generate a second driving voltage;
   wherein in an operating mode, the first driving voltage and the second driving voltage are regulated to a first driving level and a second driving level respectively as supply rails for driving a load;
   wherein in a short-circuit detection mode, the first driving voltage is regulated to the first driving level, and the second power converter is configured to operate in a pulse frequency modulation mode to regulate the second driving voltage to a short-circuit detection level, and when a switching frequency of the second power converter exceeds a threshold frequency, a short-circuit condition between the second driving voltage and the first driving voltage is determined;
   wherein the switching frequency relates to a leakage current between the second driving voltage and the first driving voltage, and a load current consumed by the load is less than a predetermined level in the short-circuit detection mode;
   wherein the switching frequency is proportional to the leakage current or proportional to the leakage current plus an offset current, wherein the offset current is consumed by the second power converter from the second driving voltage for generating the second driving voltage.

2. The power conversion circuit of claim 1, wherein in the short-circuit detection mode, one of the at least one switch of the second power converter switches with a constant ON time switching scheme in the short-circuit detection mode.

3. The power conversion circuit of claim 1, wherein in the short-circuit detection mode, the second power converter operates in a discontinuous conduction mode.

4. The power conversion circuit of claim 1, wherein the second power converter includes:
   a power stage circuit, including at least one high side switch and a low side switch which are configured to switch the inductor for generating the second driving voltage;
   a switching control circuit, configured to generate a control signal to control the at least one high side switch and the low side switch according to a difference between the second driving voltage and a reference voltage; and
   a frequency detection circuit, configured to operably measure a switching frequency of the control signal in the short-circuit detection mode to determine whether the switching frequency exceeds a threshold frequency or not, so as to determine whether the short-circuit condition occurs.

5. The power conversion circuit of claim 4, wherein in the short-circuit detection mode, the low side switch is controlled to be off, such that the second power converter operates in an asynchronous mode, wherein at least a portion of a current of the inductor flows through a body diode of the low side switch.

6. The power conversion circuit of claim 4, wherein the at least one high side switch includes a first high side switch and a second high side switch, wherein in the short-circuit detection mode, the first high side switch is controlled to be off, wherein the second high side switch and the low side switch are configured to operably switch the inductor for generating the second driving voltage to the short-circuit detection level.

7. The power conversion circuit of claim 6, wherein in the operating mode, the second high side switch is controlled to be off, wherein the first high side switch and the low side switch are controlled to switch with pulse width modulation to generate the second driving voltage to the second driving level.

8. The power conversion circuit of claim 6, wherein the second high side switch is connected between the first driving voltage and one end of the inductor, wherein in the short-circuit detection mode, the second driving voltage regulated to the short-circuit detection level is converted from the first driving voltage through switching the second high side switch.

9. The power conversion circuit of claim 8, wherein the second high side switch is connected between the first driving voltage and a switching node, the low side switch is connected between the switching node and the second driving voltage, the first high side switch is connected between an input voltage and the switching node, and the inductor is connected between the switching node and a ground node, such that the second power converter is configured as a buck-boost DC-DC converter.

10. The power conversion circuit of claim 6, wherein the switching control circuit includes:
   a comparison circuit, configured to operably compare the second driving voltage with a reference voltage to generate a comparison output signal; and
   a pulse frequency modulation circuit, configured to operably modulates the comparison output signal with a clock signal having a constant pulse width to generate the control signal in the short-circuit detection mode, so as to control the second high side switch to operate in the pulse frequency modulation mode.

11. The power conversion circuit of claim 10, wherein the frequency detection circuit counts a pulse number of the control signal within a predetermined period of time to measure the switching frequency of the control signal.

12. The power conversion circuit of claim 1, wherein a magnitude of the short-circuit detection level is smaller than a magnitude of the second driving level.

13. A short-circuit detection method for use in detecting a short-circuit condition between a first driving voltage and a second driving voltage, wherein the second driving voltage is generated by controlling at least one switch for switching an inductor; wherein in an operating mode, the first driving voltage and the second driving voltage are regulated to a first driving level and a second driving level respectively as supply rails for driving a load; wherein the short-circuit detection method performed in a short-circuit detection mode comprising:
   regulating the first driving voltage to the first driving level;
   controlling the at least one switch to operate in a pulse frequency modulation mode to regulate the second driving voltage to a short-circuit detection level; and
   detecting the short-circuit condition by determining whether a switching frequency of the at least one switch exceeds a threshold frequency;
   wherein the switching frequency relates to a leakage current between the second driving voltage and the first driving voltage, and a load current consumed by the load is less than a predetermined level in the short-circuit detection mode;
   wherein the switching frequency is proportional to the leakage current or proportional to the leakage current plus an offset current, wherein the offset current is consumed by the second power converter from the second driving voltage for generating the second driving voltage.

14. The short-circuit detection method of claim 13, wherein in the short-circuit detection mode, one of the at least one switch switches with a constant ON time switching scheme in the short-circuit detection mode.

15. The short-circuit detection method of claim 13, wherein in the short-circuit detection mode, the at least one switch operates the inductor in a discontinuous conduction mode.

16. The short-circuit detection method of claim 13, wherein the at least one switch including at least one high side switch and a low side switch which are configured to switch the inductor for generating the second driving voltage, wherein the step of controlling the at least one switch includes:
   generating a control signal to control the at least one high side switch and the low side switch according to a difference between the second driving voltage and a reference voltage; and
   measuring a switching frequency of the control signal in the short-circuit detection mode to determine whether the switching frequency exceeds a threshold frequency or not, so as to determine whether the short-circuit condition occurs.

17. The short-circuit detection method of claim 16, wherein the step of controlling the at least one switch further includes: operating the at least one high side switch and the low side switch in an asynchronous mode by controlling the low side switch to be off, wherein at least a portion of a current of the inductor flows through a body diode of the low side switch.

18. The short-circuit detection method of claim 16, wherein the at least one high side switch includes a first high side switch and a second high side switch, wherein in the short-circuit detection mode, the third switch is controlled to be off, wherein in the operating mode, the first high side switch is controlled to be off, wherein the second high side switch and the low side switch are configured to operably switch the inductor for generating the second driving voltage to the short-circuit detection level.

19. The short-circuit detection method of claim 18, wherein in the operating mode, the second high side switch is controlled to be off, wherein the first high side switch and the low side switch are controlled to switch with pulse width modulation to generate the second driving voltage to the second driving level.

20. The short-circuit detection method of claim 18, wherein the step of generating a control signal includes:
   comparing the second driving voltage with a reference voltage to generate a comparison output signal; and
   modulating the comparison output signal with a clock signal having a constant pulse width to generate the control signal in the short-circuit detection mode, so as to control the second high side switch to operate in the pulse frequency modulation mode.

21. The short-circuit detection method of claim 20, wherein the step of measuring a switching frequency includes:
   counting a pulse number of the control signal within a predetermined period of time to measure the switching frequency of the control signal.

22. The short-circuit detection method of claim 13, wherein a magnitude of the short-circuit detection level is smaller than a magnitude of the second driving level.

* * * * *